United States Patent
Chang et al.

(10) Patent No.: US 9,437,613 B2
(45) Date of Patent: Sep. 6, 2016

(54) MULTIPLE $V_T$ IN III-V FETS

(71) Applicant: International Business Machines Corporation, Armonk, NY (US)

(72) Inventors: Josephine B. Chang, Mahopac, NY (US); Isaac Lauer, Yorktown Heights, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/057,900

(22) Filed: Mar. 1, 2016

(65) Prior Publication Data

US 2016/0181277 A1    Jun. 23, 2016

Related U.S. Application Data

(62) Division of application No. 14/578,934, filed on Dec. 22, 2014, now Pat. No. 9,299,615.

(51) Int. Cl.
*H01L 27/085* (2006.01)
*H01L 27/092* (2006.01)
(Continued)

(52) U.S. Cl.
CPC ........ *H01L 27/1203* (2013.01); *H01L 29/0649* (2013.01); *H01L 29/0847* (2013.01); *H01L 29/1029* (2013.01); *H01L 29/205* (2013.01); *H01L 29/41783* (2013.01)

(58) Field of Classification Search
CPC ........... H01L 27/1054; H01L 27/1203; H01L 27/092; H01L 27/20; H01L 21/8238; H01L 21/823412; H01L 21/84
USPC ............... 257/190, 192, 194, 195, 350, 351, 257/E27.059, E27.062, E27.092, E29.31, 257/E29.246, E29.249, E21.403, E21.407, 257/E21.408, E21.633; 438/153, 172, 213, 438/285, 400, 590
See application file for complete search history.

(56) References Cited

U.S. PATENT DOCUMENTS 6,693,333 B1    2/2004 Yu
7,122,870 B2    10/2006 Barnak et al.
(Continued)

FOREIGN PATENT DOCUMENTS

JP      S6215862 A     1/1987
JP      S63219176 A    9/1988
(Continued)

OTHER PUBLICATIONS

Landru et al., "UTBOX SOI Substrate with Composite Insulating Layer," ECS Journal of Solid State Science and Technology, 2 (6) Q83-Q87 (May 2013).
(Continued)

*Primary Examiner* — Dao H Nguyen
(74) *Attorney, Agent, or Firm* — Kenneth R. Corsello; Michael J. Chang, LLC

(57) ABSTRACT

In one aspect, a method of forming a multiple $V_T$ device structure includes the steps of: forming an alternating series of channel and barrier layers as a stack having at least one first channel layer, at least one first barrier layer, and at least one second channel layer; defining at least one first and at least one second active area in the stack; selectively removing the at least one first channel/barrier layers from the at least one second active area, such that the at least one first channel layer and the at least one second channel layer are the top-most layers in the stack in the at least one first and the at least one second active areas, respectively, wherein the at least one first barrier layer is configured to confine charge carriers to the at least one first channel layer in the first active area.

9 Claims, 4 Drawing Sheets

(51) Int. Cl.

| | | |
|---|---|---|
| *H01L 29/66* | (2006.01) | |
| *H01L 29/778* | (2006.01) | |
| *H01L 21/335* | (2006.01) | |
| *H01L 27/12* | (2006.01) | |
| *H01L 29/06* | (2006.01) | |
| *H01L 29/205* | (2006.01) | |
| *H01L 29/417* | (2006.01) | |
| *H01L 29/08* | (2006.01) | |
| *H01L 29/10* | (2006.01) | |

(56) References Cited

U.S. PATENT DOCUMENTS

| | | | |
|---|---|---|---|
| 8,629,012 B2 * | 1/2014 | Lin | H01L 29/66462 257/E21.403 |
| 8,896,028 B2 * | 11/2014 | Mitsunaga | H01L 29/0646 257/194 |
| 2008/0173944 A1 | 7/2008 | Coronel et al. | |
| 2011/0024798 A1 * | 2/2011 | Tamari | H01L 21/8252 257/195 |
| 2011/0127616 A1 | 6/2011 | Hoentschel et al. | |
| 2011/0297916 A1 * | 12/2011 | Bennett | H01L 21/02398 257/24 |
| 2012/0007180 A1 | 1/2012 | Yin et al. | |
| 2012/0126291 A1 * | 5/2012 | Mitsunaga | H01L 27/0605 257/195 |
| 2012/0217479 A1 | 8/2012 | Chang et al. | |

FOREIGN PATENT DOCUMENTS

| | | |
|---|---|---|
| JP | H01175725 A | 7/1989 |
| JP | H05291519 A | 11/1993 |

OTHER PUBLICATIONS

K. Young, "Short-channel effect in fully depleted SOI MOSFETs," IEEE Transactions on Electron Devices, vol. 36, issue 2 (Feb. 1989).

Smith et al., "High rate and selective etching of GaN, AlGaN, and AlN using an inductively coupled plasma," Appl. Phys. Lett. 71 (25) (Dec. 1997).

Cooper et al., "Use of thin AlGaAs and InGaAs stop-etch layers for reactive ion etch processing of III-V compound semiconductor devices," Appl. Phys. Lett. 51, 26 (Dec. 1987).

Vurgaftman et al., "Band parameters for III-V compound semiconductors and their alloys," Journal of Applied Physics, vol. 89, No. 11 (Jun. 2001).

Computer Translation of Japanese Patent Application JPH01175725A by Ueno Kazuyoshi; NEC Corp. (Jul. 12, 1989).

Computer Translation of Japanese Patent Application JPH05291519A by Yamada Atsushi; Sharp KK (Nov. 5, 1993).

Computer Translation of Japanese Patent Application JPS63219176 A by Fuji Mashahiro; NEC corp. (Sep. 12, 1988).

Computer Translation of Japanese Patent Application JPS6215862A by Inoue Kaoru; Matsushita Electric Ind. Co Ltd. (Jan. 24, 1987).

List of IBM Patents or Applications Treated as Related.

* cited by examiner

MULTIPLE $V_T$ IN III-V FETS

CROSS-REFERENCE TO RELATED APPLICATIONS

This application is a divisional of U.S. application Ser. No. 14/578,934 filed on Dec. 22, 2014, the contents of which are incorporated by reference herein.

FIELD OF THE INVENTION

The present invention relates to multiple threshold voltage ($V_T$) field effect transistor (FET) devices and more particularly, to techniques for achieving multiple $V_T$ in III-V FETs by using an electron affinity of the III-V material to change the $V_T$.

BACKGROUND OF THE INVENTION

Multiple threshold voltages ($V_T$) are needed for microprocessors. The $V_T$ of long-channel field effect transistors (FETs) tracks flat-band voltage $V_{FB}$. For a metal-oxide semiconductor (MOS) capacitor, $V_{FB}=\phi_M-\chi$, where $\phi_M$ is metal work function, and $\chi$ is electron affinity.

Multiple $V_T$ can be achieved using multiple gate metals (multiple $\phi_M$). However, this approach is complicated because finding multiple gate metals that satisfy the $V_T$ requirement is not easy.

Therefore, improved techniques for achieving multiple $V_T$ FETs would be desirable.

SUMMARY OF THE INVENTION

The present invention provides techniques for achieving multiple threshold voltage ($V_T$) in III-V FETs by using an electron affinity of the III-V material to change the $V_T$. In one aspect of the invention, a method of forming a multiple $V_T$ device structure is provided. The method includes the steps of: forming an alternating series of channel layers and barrier layers as a stack on a side of a buried oxide (BOX) opposite a substrate, wherein the stack includes at least one first channel layer present over at least one first barrier layer, and at least one second channel layer present below the at least one first barrier layer, wherein the at least one first channel layer includes a first III-V material and the at least one second channel layer includes a second III-V material, and wherein the first III-V material has a different electron affinity from the second III-V material; defining at least one first active area and at least one second active area in the stack; selectively removing the at least one first channel layer and the at least one first barrier layer from the at least one second active area, such that the at least one first channel layer is a top-most layer in the stack in the at least one first active area, and the at least one second channel layer is a top-most layer in the stack in the at least one second active area, wherein the at least one first barrier layer is configured to confine charge carriers to the at least one first channel layer in the first active area; and forming at least one first gate on the at least one first channel layer in the at least one first active area, and at least one second gate on the at least one second channel layer in the at least one second active area, wherein the at least one first channel layer serves as a channel of a first field effect transistor (FET) in the at least one first active area, and the at least one second channel layer serves as a channel of a second FET in the at least one second active area, and wherein the first FET has a different $V_T$ from the second FET based on the different electron affinity between the first III-V material and the second III-V material.

In another aspect of the invention, a multiple $V_T$ device structure is provided. The multiple $V_T$ device structure includes: an alternating series of channel layers and barrier layers in a stack on a side of a BOX opposite a substrate, wherein the stack includes at least one first channel layer present over at least one first barrier layer, and at least one second channel layer present below the at least one first barrier layer, wherein the at least one first channel layer includes a first III-V material and the at least one second channel layer includes a second III-V material, and wherein the first III-V material has a different electron affinity from the second III-V material; at least one first active area and at least one second active area defined in the stack, wherein the at least one first channel layer is a top-most layer in the stack in the at least one first active area, and the at least one second channel layer is a top-most layer in the stack in the at least one second active area, wherein the at least one first barrier layer is configured to confine charge carriers to the at least one first channel layer in the first active area; at least one first gate on the at least one first channel layer in the at least one first active area; and at least one second gate on the at least one second channel layer in the at least one second active area, wherein the at least one first channel layer serves as a channel of a first FET in the at least one first active area, and the at least one second channel layer serves as a channel of a second FET in the at least one second active area, and wherein the first FET has a different $V_T$ from the second FET based on the different electron affinity between the first III-V material and the second III-V material.

A more complete understanding of the present invention, as well as further features and advantages of the present invention, will be obtained by reference to the following detailed description and drawings.

DETAILED DESCRIPTION OF PREFERRED EMBODIMENTS

The present techniques leverage the notion that in III-V materials there is a wide spread in electron affinity $\chi$ which enables tuning of the threshold voltage ($V_T$) over a wide range advantageously using a single gate metal (and thus avoiding the often difficult task of matching multiple metals with corresponding $V_T$ requirements—see above). Specifically, as provided above, the $V_T$ of long channel field effect transistors (FETs) tracks the flat band voltage $V_{FB}$. As known in the art, a long channel FET is a transistor with a sufficiently large enough length and width that edge effects can be neglected. For example, any device with a length greater than or equal to about 100 nanometers (nm) is considered to be a long channel transistor. The channel length in a long channel transistor is greater than the sum of the source and drain depletion widths. In a long channel transistor the threshold voltage is independent of channel length and width.

For a metal oxide semiconductor (MOS) capacitor, $V_{FB}$ is the gate metal workfunction $\phi_M$ less $\chi$. See above. With $\phi_M$ as a constant (i.e., in the present case a single gate metal is preferably employed), $V_T$ can be varied by changing $\chi$. The electron affinity $\chi$ can be changed by employing different III-V channel materials having varied $\chi$ values.

In the following example, a III-V material-based device structure is provided having multiple $V_T$ (by way of example only—three $V_T$'s are shown in the illustrative embodiment) using multiple (III-V) channel materials separated by barrier layers. The barrier layers not only provide confinement of electrons to the desired channel material, but also act as etch stop layers for process steps used in fabricating the device structure.

An exemplary methodology for fabricating the present III-V material-based device structure is now described by way of reference to FIGS. 1-9. As highlighted above, the example provided illustrates the formation of three FETs each having a different $V_T$ (hence a multiple $V_T$ device), however the same process can be performed in the same manner described to produce more or fewer FET devices than shown/described.

The term III-V semiconductor material (or simply III-V material), as used herein and throughout the following description, refers to a material that includes at least one group III element and at least one group V element. By way of example only, suitable III-V materials include, but are not limited to, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and combinations including at least one of the foregoing materials.

Figure 1:
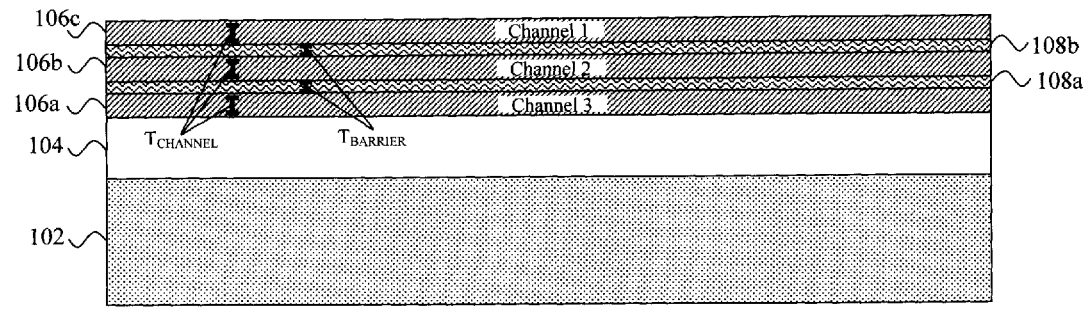
FIG. 1 is a cross-sectional diagram illustrating a starting structure for forming a multiple threshold voltage ($V_T$) III-V material-based device structure having an alternating series of (III-V) channel layers and (III-V) barrier layers formed as a stack on a side of a buried oxide (BOX) opposite a substrate according to an embodiment of the present invention.

To begin the process, as shown in FIG. 1 a substrate 102 is provided. Substrate 102 provides a platform for building the device, and therefore any suitable semiconductor device substrates may be employed. By way of example only, the substrate 102 is formed from a bulk semiconductor (e.g., silicon (Si), germanium (Ge), silicon germanium (SiGe), etc.) wafer. A buried oxide (or BOX) 104 is then formed on the substrate 102. While any suitable oxide material may be used as the BOX, according to one exemplary embodiment, the BOX 104 is an alumina ($Al_2O_3$)/silicon dioxide ($SiO_2$) composite BOX. $Al_2O_3$/$SiO_2$ composite BOX structures are described, for example, in Landru et al., "UTBOX SOI Substrate with Composite Insulating Layer," ECS Journal of Solid State Science and Technology, 2 (6) Q83-Q87 (May 2013) (hereinafter "Landru"), the contents of which are incorporated by reference as if fully set forth herein. For example, processes are described in Landru for forming a $SiO_2$/$Al_2O_3$/$SiO_2$ composite BOX structure.

Next, as shown in FIG. 1, an alternating series of channel layers 106 and barrier layers 108 are then formed as a stack on a side of the BOX 104 opposite the substrate 102. According to an exemplary embodiment, each of the channel layers 106 and each of the barrier layers 108 will be formed from a III-V material. The selection criteria for the III-V material used in the channel/barrier layers is as follows: 1) each of the barrier layers is formed from a III-V material having a wider band gap than the (III-V) channel layer immediately on top of the barrier layer in the stack; and 2) a given one of the channel layers is formed from a III-V material with a different electron affinity $\chi$ from at least one other of the (III-V) channel layers (preferably the channel layers are all formed from different III-V materials having different electron affinities). With regard to the first criteria, one purpose of the barrier layers is to confine the charge carriers in each of the FETs to the (III-V) channel layer immediately on top of the barrier layer in the stack—e.g., by selecting a wider band gap III-V material for the barrier layer. By way of example, only suitable (III-V) barrier layer/channel layer combinations for the stack can include channel layer 1, channel layer 2, and channel layer 3 each being formed from a III-V indium gallium arsenide (In-GaAs) material having the formula $In_xGa_{1-x}As$, where x has three different values to modify the electron affinity for each of the channel layers, e.g., x=0.4, 0.3, 0.2 for channel layers 1, 2, and 3, respectively. The barrier layers could each be a gallium arsenide material, a III-V aluminum arsenide material, or a III-V aluminum gallium arsenide (AlGaAs) material having the formula $Al_yGa_{1-y}As$. An analogous material system would be employing a III-V gallium arsenide antimonide (GaAsSb) material for each of the channel layers, and varying the As and Sb percentage for each of the channel layers 1, 2, and 3. In that case, the barrier layers could each be a III-V gallium antimonide material, a III-V aluminum antimonide material, or a III-V gallium aluminum antimonide material. Suitable barrier layer thicknesses might be from about 2 nanometers (nm) to about 20 nm, and ranges therebetween, e.g., about 20 nm, and suitable channel layer thicknesses might be from about 10 nm to about 40 nm, and ranges therebetween, e.g., about 20 nm. See below. Further, with regard to the second criteria, the $V_T$ of the FETs formed will be varied based on the electron affinity $\chi$ of the top-most channel layer in the stack (the channel layer on which the gate stack is formed and to which the charge carriers are confined). Thus, varying the material used in the channel layers amongst III-V materials with differing electron affinity $\chi$ will serve to vary the $V_T$ of the FETs formed using those channel layers.

It is notable that for the present III-V barrier and channel layer materials, electron affinity will to a large degree move with materials band gap. As provided above, a (III-V) barrier layer will preferably have a larger bandgap than a (III-V) channel layer. For a general discussion of III-V material band gap see, for example, Vurgaftman et al., "Band parameters for III-V compound semiconductors and their alloys," Journal of Applied Physics, vol. 89, no. 11 (June 2001), the contents of which are incorporated by reference as if fully set forth herein.

Exemplary III-V materials were provided above. According to an exemplary embodiment, each of channel layers and barrier layers described herein are selected from those exemplary III-V materials in accordance with the above selection criteria. Further, for clarity, the designations first, second, etc. may be used to refer to the III-V materials used in the layers. For example, it may be described herein that (e.g., a first) one of the channel layers or barrier layers is formed from a first III-V material, and (e.g., a second) one of the channel layers or barrier layers is formed from a second III-V material, etc.

Standard epitaxial techniques can be used to grow the III-V-based channel layers 106 and barrier layers 108 on the BOX 104. According to an exemplary embodiment, the channel layers 106 are all formed having a same thickness $T_{CHANNEL}$, and the barrier layers are all formed having a same thickness $T_{BARRIER}$. See FIG. 1. This is however not a requirement, and a thickness of one or more of the channel and/or barrier layers may be individually tailored for a particular application. By way of example only, $T_{CHANNEL}$ is preferably from about 10 nanometers (nm) to about 40 nm, and ranges therebetween, e.g., about 20 nm.

With regard to electrostatics such as short channel effects, the channel layers are preferably formed to be as thin as possible, e.g., $T_{CHANNEL}$ is within the above-provided ranges, and further the channel layers 106 are preferably all formed having the same thickness $T_{CHANNEL}$. As is known in the art, short channel effects occur when the channel length is on the same order of magnitude as the depletion layer widths of the source and drain junctions. Short channel effects can arise when channel lengths are scaled. Short channel effects can be reduced by decreasing the channel layer thickness. See, for example, K. Young, "Short-channel effect in fully depleted SOI MOSFETs," IEEE Transactions on Electron Devices, vol. 36, issue 2 (February 1989), the contents of which are incorporated by reference as if fully set forth herein.

Further, by choosing the correct barrier layer material and thickness $T_{BARRIER}$, all of the charge carriers for the corresponding FET can be limited to the channel layer immediately on top of the barrier layer in the stack. In the current example, it is desirable to limit the charge carriers to the top-most channel layer in the stack (i.e., the channel layer on which the gate stack is formed)—for instance channel layer 1 (also referred to herein as "Ch 1") for a FET 1, channel layer 2 (also referred to herein as "Ch 2") for a second FET, and channel layer 3 (also referred to herein as "Ch 3") for a third FET—see below. By way of example only, a $T_{BARRIER}$ of from about 2 nm to about 20 nm, and ranges therebetween, e.g., about 20 nm, can be used to obtain greater than a 90% electron confinement in the channel layer that sits on top of the barrier layer (i.e., by comparison with the barrier layer, the channel layer has a lower bandgap and thus a higher electron affinity). Further, as will be highlighted below, the barrier layers also serve as an etch stop layer in subsequent processing steps.

Referring to FIG. 1, a channel layer 106a is formed on a side of the BOX 104 opposite the substrate 102. This channel layer 106a will correspond to the third channel layer in the stack, and thus is labeled "Channel 3." A barrier layer 108a is then formed on a side of the channel layer 106a opposite the BOX 104. A channel layer 106b is formed on a side of the barrier layer 108a opposite the channel layer 106a. This channel layer 106b will correspond to the second channel layer in the stack, and thus is labeled "Channel 2." A barrier layer 108b is then formed on a side of the channel layer 106b opposite the barrier layer 108a. Finally, a channel layer 106c is formed on a side of the barrier layer 108b opposite the channel layer 106b. This channel layer 106c will correspond to the first channel layer in the stack, and thus is labeled "Channel 1." Again, the number of layers depicted in the figures is merely exemplary, and more or fewer channel and/or barrier layers may be employed than is described/depicted.

Figure 2:
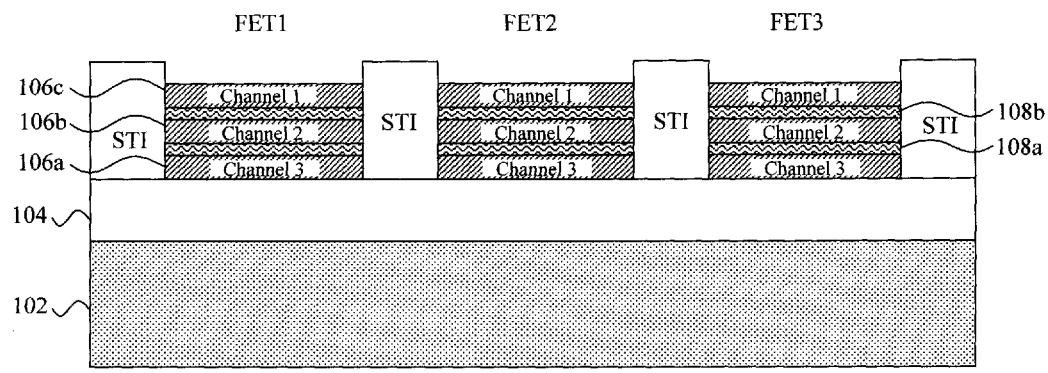
FIG. 2 is a cross-sectional diagram illustrating multiple (e.g., a first, second, and third) separate active areas having been defined in the stack using shallow trench isolation (STI) according to an embodiment of the present invention.

Next, as shown in FIG. 2 three separate active areas are defined in the stack using shallow trench isolation (STI). These three active areas will correspond to three separate FET devices (each FET device having a different $V_T$—see below)—and thus are labeled as "FET1," "FET2," and "FET3." As is known in the art, STI involves patterning trenches in the active area (in this case the stack of channel and barrier layers) and then filling the trenches with an insulator, such as an oxide material (labeled "STI"). According to the present example, three active areas are defined. However, this is merely an example intended to illustrate the present techniques, and more or fewer active areas may be employed than is described/depicted. By way of example only, there might alternatively be multiple FET1 active areas, multiple FET2 active areas, and/or multiple FET3 active areas formed in the same manner.

As shown in FIG. 2, the STI insulator extends completely through each of the channel layers, down to the BOX 104. That way isolation of the active areas through each of the channel layers is achieved. Further, as shown in FIG. 2 the STI insulator preferably overfills the trenches and extends above the surface of the top-most channel layer in the stack.

As provided above, channel layer 1 will serve as the channel layer for FET 1 (i.e., the top-most channel layer in the stack for FET 1 to which the charge carriers are confined), channel layer 2 will serve as the channel layer for FET 2 (i.e., the top-most channel layer in the stack for FET 2 to which the charge carriers are confined), and channel layer 3 will serve as the channel layer for FET 3 (i.e., the top-most channel layer in the stack for FET 3 to which the charge carriers are confined). To achieve this configuration, a series of etching steps are next performed to selectively remove the unneeded channel layers from the respective stacks.

Figure 3:
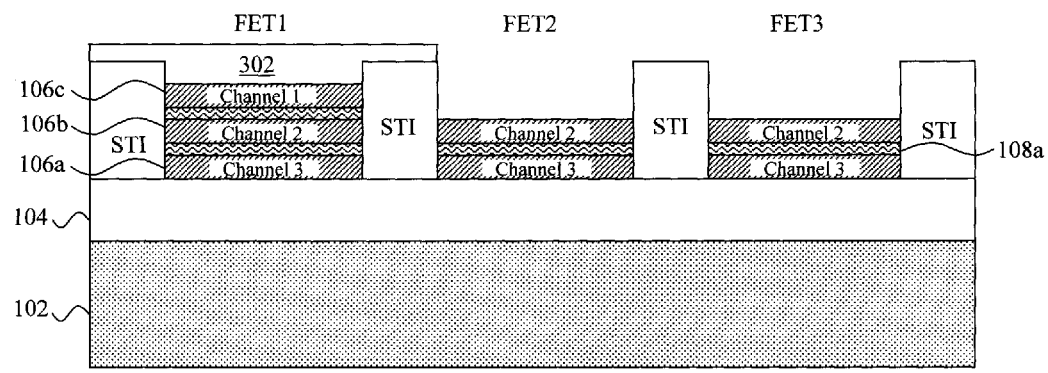
FIG. 3 is a cross-sectional diagram illustrating a first one of the channel layers and a first one of the barrier layers having been removed from the second and third active areas according to an embodiment of the present invention.

By way of example only, as shown in FIG. 3 a mask 302 is first formed covering/masking the FET 1 stack, and an etching process is used to remove the channel layer 1 (channel layer 106c) from the FET 2 and the FET 3 stacks. According to an exemplary embodiment, mask 302 is a resist mask formed using standard lithography and etching techniques. A selective etching process such as reactive ion etching (RIE) can be performed to remove the channel layer 1 (channel layer 106c) from the FET 2 and the FET 3 stacks.

Advantageously, the alternating channel and barrier layers in the stack provide convenient etch stops. For instance, the removal of the channel layer 1 from the FET 2 and the FET 3 stacks can be accomplished using two selective RIE steps. First, a RIE etch of the III-V material of the channel layer 1 (channel layer 106c) is performed selective to the III-V material of the barrier layer 108b. It is well within the capabilities of one skilled in the art to tailor the etch chemistry to achieve etch selectivity of one III-V material over another. For instance, the selective etching method using various gas chemistries and stop layer is fairly well known in the art. See, for example, Smith et al., "High rate and selective etching of GaN, AlGaN, and AlN using an inductively coupled plasma," Appl. Phys. Lett. 71 (25) (December 1997); and Cooper et al., "Use of thin AlGaAs and InGaAs stop-etch layers for reactive ion etch processing of III-V compound semiconductor devices," Appl. Phys. Lett. 51, 26 (December 1987), the contents of both of which are incorporated by reference as if fully set forth herein. Second, a RIE etch of the III-V material of the barrier layer 108b is performed selective to the III-V material of the channel layer 2 (channel layer 106b). The result is that the channel layer 2 is now the top-most layer in both the FET 2 and the FET 3 stacks (which will be subsequently removed from the FET 3 stack—see below). The mask 302 can be removed (or left in place to protect the FET 1 stack during subsequent etching processes).

Figure 4:
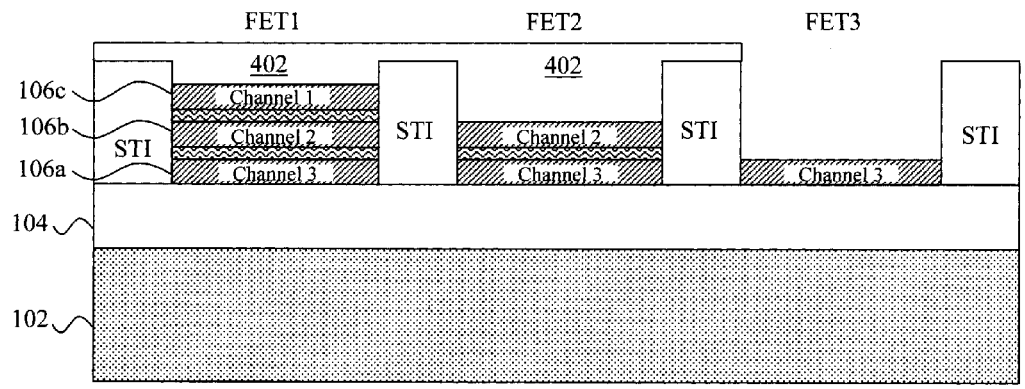
FIG. 4 is a cross-sectional diagram illustrating a second one of the channel layers and a second one of the barrier layers having been removed from the third active area such that the first channel layer is the top-most layer in the stack in the first active area, the second channel layer is the top-most layer in the stack in the second active area, and the third channel layer is the top-most layer in the stack in the third active area according to an embodiment of the present invention.

As shown in FIG. 4, the same process is repeated to selectively remove the channel layer 2 (channel layer 106b) from the FET 3 stack. Specifically, as shown in FIG. 4 a mask 402 is first formed covering/masking the FET 1 and FET 2 stacks, and an etching process is used to remove the channel layer 2 (channel layer 106b) from the FET 3 stack. If the mask 302 is still in place (see above) then mask 402 needs only be formed covering the FET 2 stack. However, if the mask 302 was previously removed, then the mask 402 is formed covering both the FET 1 and FET 2 stacks. It is this latter configuration that is shown illustrated in FIG. 4. In either case, what is important is that both the FET 1 and FET 2 stacks are masked during the etch performed to remove the channel layer 2 from the FET 3 stack. As with mask 302, mask 402 can be a resist mask formed using standard lithography and etching techniques.

A selective etching process such as RIE can be performed to remove the channel layer 2 (channel layer 106b) from the FET 3 stack. Again, the alternating channel and barrier layers in the stack provide convenient etch stops. For instance, the removal of the channel layer 2 from the FET 3 stack can be accomplished using two selective RIE steps. First, a RIE etch of the III-V material of the channel layer 2 (channel layer 106b) is performed selective to the III-V material of the barrier layer 108a. Second, a RIE etch of the III-V material of the barrier layer 108a is performed selective to the III-V material of the channel layer 3 (channel layer 106a). The result is that the channel layer 3 is now the top-most layer in the FET 3 stack. The mask 302 and/or 402 can now be removed.

The remainder of the process flow provides an example of steps that can be used to complete the device. However, the FET 1, FET 2, and FET 3 channel layer stacks at this point can be used as the platform for any desired device configuration, including those having III-V channel layers with varying electron affinity $\chi$.

Figure 5:
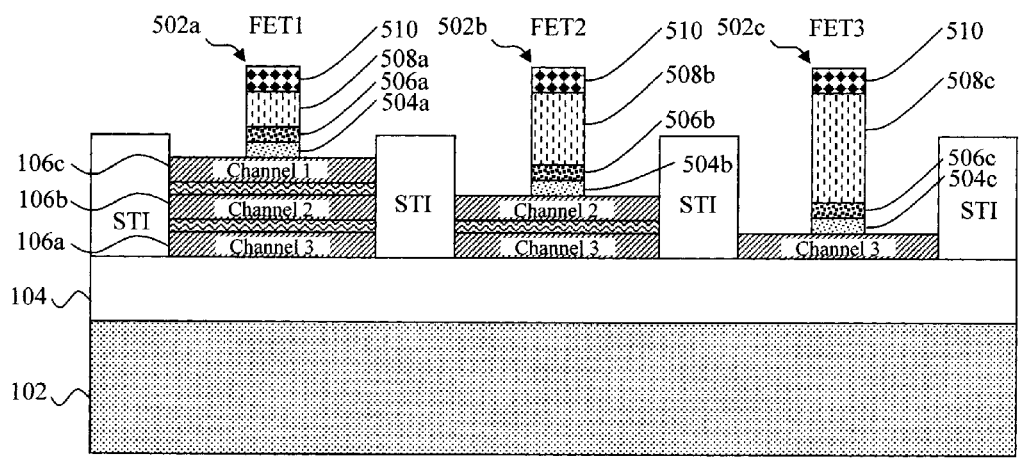
FIG. 5 is a cross-sectional diagram illustrating gates having been formed on the stacks in each of the active areas according to an embodiment of the present invention.

By way of example only, as shown in FIG. 5 gates 502 (one gate 502a, 502b, 502c, corresponding to each of the FET 1, FET 2, and FET 3 channel/barrier layer stacks, respectively) are formed on the FET 1, FET 2, and FET 3 stacks in each of the active areas. According to an exemplary embodiment, each of the gates 502 includes a gate dielectric 504 on the top-most channel layer in the stack, a metal gate layer 506 on a side of the gate dielectric 504 opposite the channel layer, and a semiconductor gate layer 508 on a side of the metal gate layer 506 opposite the gate dielectric 504. For clarity, each of these gate layers is given the reference numeral designation a, b, or c corresponding to gates 502 a, b, or c, respectively.

By way of example only, the gate stacks 502 can be formed by blanket depositing each of the gate layers in succession onto the structure, and then patterning the gate layers into the distinct gates 502 a, b, and c. For example, a blanket layer of the gate dielectric 504 can be deposited onto the structure covering the top-most channel layer in each of the FET stacks and the STI regions. A blanket layer of the metal gate layer 506 can be deposited onto a side of the gate dielectric 504 opposite the top-most channel layer in each of the FET stacks/the STI regions. A blanket layer of the semiconductor gate layer 508 can then be deposited onto a side of the metal gate layer 506 opposite the gate dielectric 504.

Suitable gate dielectric materials include, but are not limited to, oxides such as $SiO_2$ (low-κ) and hafnium or lanthanum oxide (high-κ). Suitable gate metals include, but are not limited to, platinum (Pt), palladium (Pd), nickel (Ni) and/or alloys containing at least one of the foregoing metals. Suitable semiconductor gate materials include, but are not limited to, poly-silicon.

From the above-described exemplary gate formation process it is apparent that a same (i.e., single) gate metal is used for each of the gates 502. As described herein, it is through the selection of III-V channel layer materials having differing electron affinity $\chi$ that the $V_T$ of the devices is modulated.

Optionally, the deposited gate layers can be planarized using a process, such as chemical-mechanical polishing (CMP). As shown in FIG. 5, planarizing the gate layers ensures that the gates 502a, b, and c, all have the same height (despite the fact that they are being constructed on FET stacks of different thicknesses).

A standard gate lithography and etching process may then be employed to pattern the gate layers into the individual gates 502 a, b, and c. By way of example only, as shown in FIG. 5, a gate hard mask 510 may be formed masking the footprint and location of each of the gates 502. An etching process such as RIE can then be used to pattern the gate layers around the hardmask 510 to form the gates 502 a, b, and c. Following the gate etch, the hardmask 510 can be removed, or optionally (as shown in the figures) left in place to protect the gates during subsequent processing steps.

Figure 6:
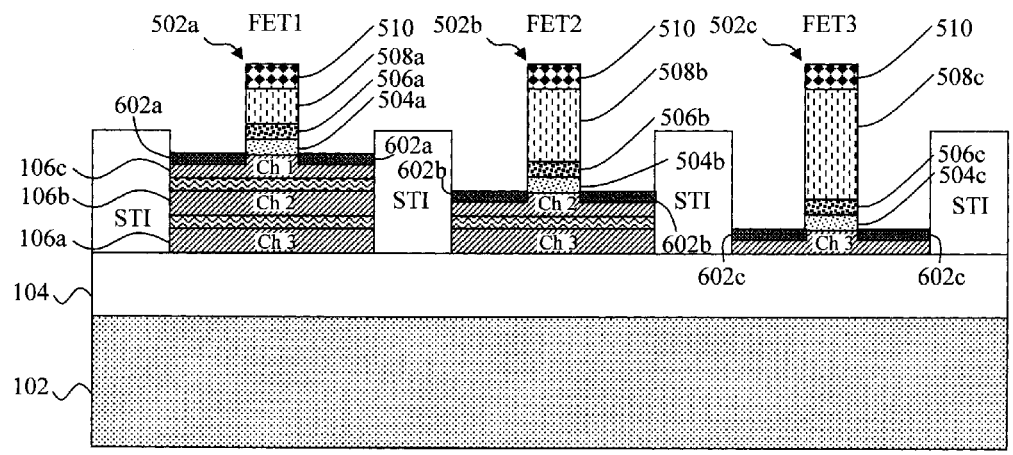
FIG. 6 is a cross-sectional diagram illustrating implant extensions having been formed in the top-most channel layer in each of the stacks on opposite sides of the gates according to an embodiment of the present invention.

Next, as shown in FIG. 6 implant extensions 602 are formed in the top-most channel layer in each of the stacks on opposite sides of the gates 502. As noted above, the top-most channel layer in each of the stacks is the channel layer to which the charge carriers are confined and thus this top-most channel layer serves as the channel for the respective FET. For ease of depiction, the channel layers are now being abbreviated in the figures as "Ch 1," "Ch 2," and "Ch 3." Accordingly, the channel layer Ch 1 serves as the channel layer in FET 1, the channel layer CH 2 serves as the channel layer in FET 2, and the channel layer Ch 3 serves as the channel layer in FET 3.

Standard dopant implantation and activation processes may be employed to form the implant extensions 602. By way of example only, suitable p-type dopants include, but are not limited to, boron; and suitable n-type dopants include, but are not limited to, phosphorous. As shown in FIG. 6, implant extensions 602a are formed into the top-most channel layer (Ch 1—channel layer 106c) on opposite sides of the gate 502a in the stack in the active region of FET 1, implant extensions 602b are formed into the top-most channel layer (Ch 2—channel layer 106b) on opposite sides of the gate 502b in the stack in the active region of FET 2, and implant extensions 602c are formed into the top-most channel layer (Ch 3—channel layer 106a) on opposite sides of the gate 502c in the stack in the active region of FET 3.

Figure 7:
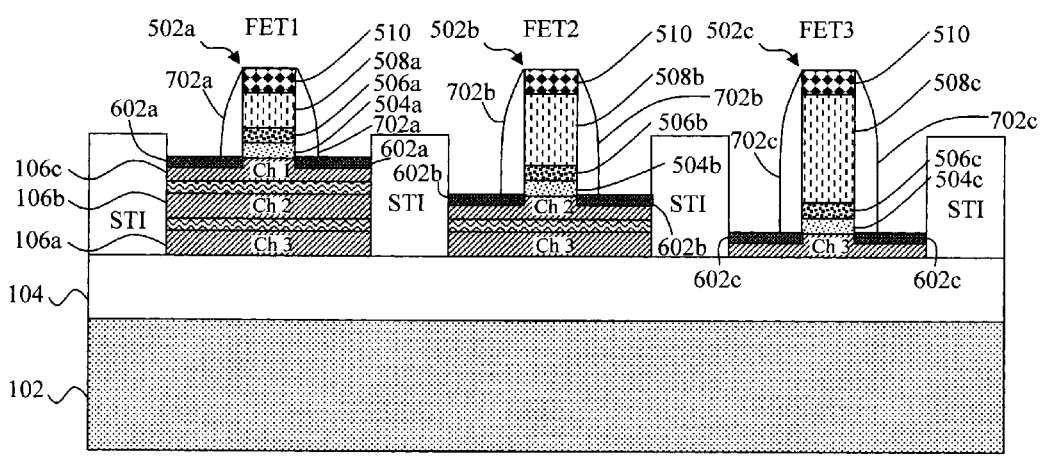
FIG. 7 is a cross-sectional diagram illustrating spacers having been formed on opposite sides of each of the gates according to an embodiment of the present invention.

Spacers 702 can then be formed on opposite sides of each of the gates. See FIG. 7. The spacers 702 serve to offset the gates 502 from the source and drain regions (see below) of the FET devices. The spacers 702 can be formed by first blanket depositing a spacer material onto the structure, and then using standard lithography and etching (e.g., RIE) to pattern the spacer material into the individual spacers 702. Suitable spacer materials include, but are not limited to, a nitride spacer material such as silicon nitride. As shown in FIG. 7, spacers 702a are formed on opposite sides of the gate 502a in the active region of FET 1, spacers 702b are formed on opposite sides of the gate 502b in the active region of FET 2, and spacers 702c are formed on opposite sides of the gate 502c in the active region of FET 3.

Figure 8:
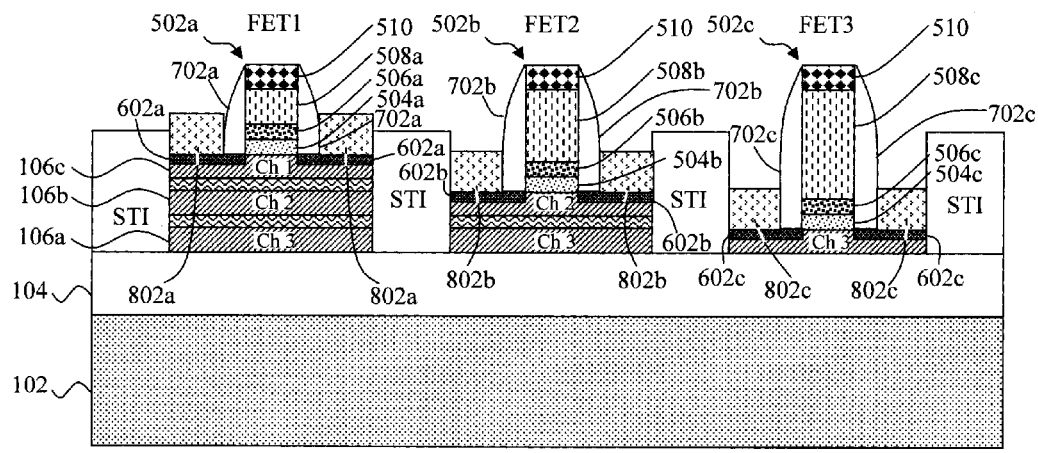
FIG. 8 is a cross-sectional diagram illustrating raised source and drain regions having been formed on the top-most channel layer in each of the stacks on opposite sides of the gates according to an embodiment of the present invention.

Next, as shown in FIG. 8 raised source and drain regions 802 are formed on the top-most channel layer in each of the stacks on opposite sides of the gates 502. By way of example only, the raised source and drain regions 802 can be formed using an epitaxial growth process. The parameters for a standard epitaxial process for forming raised source and drain (RSD) regions would be apparent to one skilled in the art, and thus are not described further herein. According to an exemplary embodiment, the raised source and drain regions 802 are formed from an in-situ n-doped III-V material such as gallium arsenide, indium gallium arsenide, gallium antimonide, and/or indium arsenide. As shown in FIG. 8, raised source and drain regions 802a are formed on opposite sides of the gate 502a in the active region of FET 1, raised source and drain regions 802b are formed on opposite sides of the gate 502b in the active region of FET 2, and raised source and drain regions 802c are formed on opposite sides of the gate 502c in the active region of FET 3.

Figure 9:
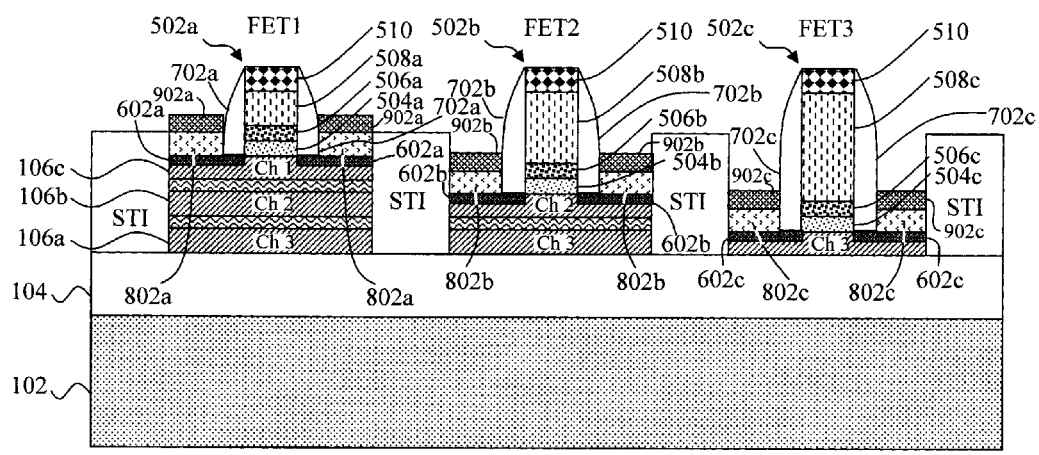
FIG. 9 is a cross-sectional diagram illustrating contacts having been formed to each of the raised source and drain regions according to an embodiment of the present invention.

Finally, as shown in FIG. 9 contacts 902 (also referred to herein as source and drain contacts) are formed to each of the raised source and drain regions 802. By way of example only, contacts 902 can be formed using a salicide (self-aligned silicide) process, wherein a silicide metal is deposited onto the structure. The silicide metal will only react with exposed semiconductor—i.e., a self-aligned process. In the example depicted, the hard mask 510 prevents silicidation of the gates 502. Suitable silicide metals include, but are not limited to, nickel (Ni). An annealing process (such as rapid thermal annealing (RTA)) is then performed to react the silicide metal with the (e.g., in-situ n-doped III-V material) in the raised source and drain regions 802. As known in the art, the annealing temperature, duration, etc. and/or amount of silicide metal deposited can be used to control the amount of silicide formed for the contacts 902. Adjusting these silicidation parameters would be within the capabilities of one skilled in the art.

A selective (e.g., wet or dry) etching process can then be used to remove the unreacted metal. As shown in FIG. 9, contacts 902a are formed to the raised source and drain regions 802a, contacts 902b are formed to the raised source and drain regions 802b, and contacts 902c are formed to the raised source and drain regions 802c.

Any further standard metallization and/or back-end-of-line processing may be performed if so desired. It is notable that the same techniques provided herein could be employed in the same manner described to produce a variety of different device configurations. For instance, as highlighted above, one could in the same manner described produce multiple FET1 and/or FET2 and/or FET3 stacks. Also, to increase the number of different $V_T$ FETs produced, one might start out with more than 3 channel layers in the preliminary channel layer/barrier layer stack. To use an illustrative example, employing four (rather than three channel layers)—i.e., Ch 1-Ch 4, could result in the production of four FETs (i.e., FET1-FET4) each having a different $V_T$. The present techniques are, for example, broadly applicable to any configuration having at least two different $V_T$ III-V based FETs wherein a stack of (III-V) channel/(III-V) barrier layers can be selectively processed in the manner described above to produce a different top-most channel for each of the differing $V_T$ FETs.

It is notable that terms such as "first," "second," etc. may be used herein to refer to and/or distinguish various components of the device structure, but this does not imply any particular order. For instance, reference may be made to a first channel layer or a first barrier layer or a first III-V material so as to distinguish these components from a second, third, etc. instance of these components.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A multiple $V_T$ device structure, comprising:
   an alternating series of channel layers and barrier layers in a stack on a side of a BOX opposite a substrate, wherein the stack comprises at least one first channel layer present over at least one first barrier layer, and at least one second channel layer present below the at least one first barrier layer, wherein the at least one first channel layer comprises a first III-V material and the at least one second channel layer comprises a second III-V material, and wherein the first III-V material has a different electron affinity from the second III-V material;
   at least one first active area and at least one second active area defined in the stack, wherein the at least one first channel layer is a top-most layer in the stack in the at least one first active area, and the at least one second channel layer is a top-most layer in the stack in the at least one second active area, wherein the at least one first barrier layer is configured to confine charge carriers to the at least one first channel layer in the first active area;
   at least one first gate on the at least one first channel layer in the at least one first active area; and
   at least one second gate on the at least one second channel layer in the at least one second active area,
   wherein the at least one first channel layer serves as a channel of a first FET in the at least one first active area, and the at least one second channel layer serves as a channel of a second FET in the at least one second active area, and wherein the first FET has a different $V_T$ from the second FET based on the different electron affinity between the first III-V material and the second III-V material.

2. The multiple $V_T$ device structure of claim 1, wherein the at least one first barrier layer comprises a wider band gap III-V material than the first III-V material.

3. The multiple $V_T$ device structure of claim 1, wherein the at least one first gate and the at least one second gate each both comprise a gate dielectric, a gate metal layer on the gate dielectric, and a semiconductor gate layer on a side of the gate metal layer opposite the gate dielectric.

4. The multiple $V_T$ device structure of claim 3, wherein the gate metal layer comprises a same gate metal in both the at least one first gate and the at least one second gate.

5. The multiple $V_T$ device structure of claim 1, further comprising:
   spacers on opposite sides of the at least one first gate and on opposite sides of the at least one second gate; and
   raised source and drain regions on the at least one first channel layer on opposite sides of the at least one first gate, and on the at least one second channel layer on opposite sides of the at least one second gate.

6. The multiple $V_T$ device structure of claim 5, further comprising:
   contacts to the raised source and drain regions.

7. The multiple $V_T$ device structure of claim 1, wherein the stack further comprises at least one second barrier layer below the at least one second channel layer and at least one third channel layer below the at least one second barrier layer, wherein the at least one third channel layer comprises a third III-V material, and wherein the third III-V material has a different electron affinity from both the first III-V material and the second III-V material.

8. The multiple $V_T$ device structure of claim 7, further comprising:
   at least one third active area defined in the stack, wherein the at least one third channel layer is a top-most layer in the stack in the at least one third active area, and wherein the at least one second barrier layer is configured to confine charge carriers to the at least one third channel layer in the third active area.

9. The multiple $V_T$ device structure of claim 8, further comprising:
   at least one third gate on the at least one third channel layer in the at least one third active area, wherein the at least one third channel layer serves as a channel of a third FET in the at least one third active area, and wherein the third FET has a different $V_T$ from both the first FET and the second FET based on the different electron affinity between the first III-V material, the second III-V material, and the third III-V material.

* * * * *